US011202383B2

(12) United States Patent
Lin

(10) Patent No.: US 11,202,383 B2
(45) Date of Patent: Dec. 14, 2021

(54) HARD DRIVE ENCLOSURE

(71) Applicant: LANNER ELECTRONICS INC., New Taipei (TW)

(72) Inventor: Tse-Min Lin, New Taipei (TW)

(73) Assignee: LANNER ELECTRONICS INC., New Taipei (TW)

( * ) Notice: Subject to any disclaimer, the term of this patent is extended or adjusted under 35 U.S.C. 154(b) by 2 days.

(21) Appl. No.: 16/903,684

(22) Filed: Jun. 17, 2020

(65) Prior Publication Data
US 2021/0259123 A1 Aug. 19, 2021

(30) Foreign Application Priority Data

Feb. 14, 2020 (TW) .................................. 109201650

(51) Int. Cl.
*G06F 1/16* (2006.01)
*H05K 5/00* (2006.01)
*H05K 7/00* (2006.01)
*H05K 5/02* (2006.01)
*H05K 9/00* (2006.01)
*H05K 7/14* (2006.01)
*H05K 5/03* (2006.01)

(52) U.S. Cl.
CPC .......... *H05K 5/0295* (2013.01); *H05K 5/023* (2013.01); *H05K 5/0213* (2013.01); *H05K 5/0247* (2013.01); *H05K 5/03* (2013.01); *H05K 7/1461* (2013.01); *H05K 9/0022* (2013.01)

(58) Field of Classification Search
CPC .... H05K 5/0295; H05K 5/0213; H05K 5/023; H05K 5/0247; H05K 5/03; H05K 5/0286; H05K 5/0256; H05K 5/0217; H05K 7/1461; H05K 9/0022; H05K 9/002; H05K 9/0007
See application file for complete search history.

(56) References Cited

U.S. PATENT DOCUMENTS

| 9,462,726 | B1 * | 10/2016 | Huang | .................... G06F 1/187 |
| 9,999,153 | B1 * | 6/2018 | Peng | .................. H05K 7/20727 |
| 2013/0127310 | A1 * | 5/2013 | Yu | ......................... G11B 33/128 |
| | | | | 312/223.2 |
| 2014/0078657 | A1 * | 3/2014 | Xu | .......................... G06F 1/189 |
| | | | | 361/679.02 |
| 2014/0085802 | A1 * | 3/2014 | Ning | ....................... G06F 1/183 |
| | | | | 361/679.31 |
| 2016/0041590 | A1 * | 2/2016 | Yu | ........................... G06F 1/185 |
| | | | | 361/679.32 |

(Continued)

*Primary Examiner* — Anthony M Haughton

(57) ABSTRACT

A hard drive enclosure with functionality of quick-release, is for application in a host computer, and comprises: an accommodating unit, a plurality of removable units, a connection inter face module, and a connection module. Wherein the accommodating unit has an accommodating space and a receiving opening. And the plurality of removable units is inserted into the accommodating space through the receiving opening, and each of the plurality of removable units carries with a storage device. In the present invention, according to particular design of electrical connectors constituted by printed circuit board assembly, so as to improve insufficient space for electrical routing. In other words, the hard drive enclosure of the present invention includes advantages of decreasing assembly time and low production cost.

9 Claims, 9 Drawing Sheets

(56) References Cited

U.S. PATENT DOCUMENTS

| | | | |
|---|---|---|---|
| 2016/0044820 A1* | 2/2016 | Xu | H05K 7/20727 |
| | | | 361/679.31 |
| 2016/0135322 A1* | 5/2016 | Chen | G11B 33/142 |
| | | | 361/679.46 |
| 2017/0150635 A1* | 5/2017 | Huang | H05K 7/1492 |
| 2018/0098455 A1* | 4/2018 | Ni | H05K 7/20754 |
| 2018/0359878 A1* | 12/2018 | Xu | H05K 7/20136 |
| 2021/0037668 A1* | 2/2021 | Syu | G06F 1/183 |
| 2021/0204437 A1* | 7/2021 | Liang | H05K 1/141 |

* cited by examiner

HARD DRIVE ENCLOSURE

BACKGROUND OF THE INVENTION

1. Field of the Invention

The present invention relates to the technology field of data storage device, and more particularly to a hard drive enclosure with functionality of quick-release.

2. Description of the Prior Art

Along with the advance and development of technology, requirements of storage device and associated product for storing large amounts of information are also gradually increasing. For instance, office, Data center, and Network attached storage both require a considerable amount of storage device and associated product.

Hard disk drive (HDD) is an electronic device used for storing and transferring data. The two most common sizes of HDD are 2.5 inch and 3.5 inch. By comparison between the 2.5-inch HDD and the 3.5-inch one, there are their advantages and disadvantages described as follows. For instance, the 2.5-inch HDD is lighter and smaller than the 3.5-inch HDD, and the selling price of the 3.5-inch HDD is cheaper than that of the 2.5-inch HDD. Therefore, user is depending on the situation to use the 2.5-inch HDD or the 3.5-inch HDD. It is conceivable that, the user certainly installed various hard disk drives in an identical computer thereof. Therefore, how to enhance and provide an outstanding device for reading HDD efficiently has become an important issue.

FIG. 1 illustrates a top view of a conventional data reader. As shown in FIG. 1, the conventional data reader 1' comprises a first read unit 11' for reading a 3.5-inch HDD 3', a second read unit 12' for reading a 2.5-inch HDD 4', an electrical connector 13', and a power connector 14'. Moreover, the conventional data reader 1' reads an information in the 2.5-inch HDD 4' through the electrical connector and the second read unit 12'. Although the conventional data reader 1' provides a method and device for reading HDDs with different sizes, the data reader 1' still has disadvantage as follows:

(1) As the engineer skilled in electronic design well know, it is needed to avoid overbending electric wires. As shown in FIG. 1, because of the different sizes and the positions between the 2.5-inch HDD and the 3.5-inch HDD, such that a space for routing the electric wires is too narrow. It is causing that an assembly worker has to adjust the electric wires one by one. Moreover, FIG. 1 also shows that the electric wires be over bended in the conventional data reader 1', so as to decrease serviceable life thereof. Therefore, the data reader 1' includes a disadvantage of decreasing manufacturing efficiency.

From above descriptions, it should know that there is room for improvement in the conventional data reader. In view of that, inventors of the present application have made great efforts to make inventive research and eventually provided a hard drive enclosure with functionality of quick-release.

SUMMARY OF THE INVENTION

The primary objective of the present invention is to disclose a hard drive enclosure with functionality of quick-release, is for application in a host computer, and comprises: an accommodating unit, a plurality of removable units, a connection interface module, and a connection module. Wherein, the accommodating unit has an accommodating space and a received opening. Moreover, the plurality of removable units is inserted into the accommodating space through the received opening, and each of the plurality of removable units carries with a storage device. In the present invention, the connection interface module is electrically connected to the connection module and at least one electrical connection member in the host computer, such that the host computer is capable of reading information in the storage device.

In order to achieve the primary objective of the present invention, the inventor of the present invention provides an embodiment for the hard drive enclosure with functionality of quick-release, is for application in a host computer, and comprise: an accommodating unit, having an accommodating space and a received opening;

a plurality of removable units, being inserted into the accommodating space through the received opening, and each of the plurality of removable units carries with a storage device;

a connection interface module, being disposed in the accommodating space, and comprising a plurality of connection portions that are disposed to face the receiving opening and a first electrical connector that is connected to the plurality of connection portions;

a connection module, being disposed on an outer surface of the accommodating unit, and having a second electrical connector and a third electrical connector, wherein the second electrical connector is extended into the accommodating space 10 for being electrically connected to the first electrical connector of the connection interface module, and the third electrical connector is electrically connected to at least one electrical connection member in the host computer;

wherein the respective storage devices are electrically connected to the respective connection portions.

BRIEF DESCRIPTION OF THE DRAWINGS

The invention as well as a preferred mode of use and advantages thereof will be best understood by referring to the following detailed description of an illustrative embodiment in conjunction with the accompanying drawings, wherein.

DETAILED DESCRIPTION OF THE PREFERRED EMBODIMENTS

To more clearly describe a hard drive enclosure according to the present invention, embodiments of the present invention will be described in detail with reference to the attached drawings hereinafter.

Figure 1:
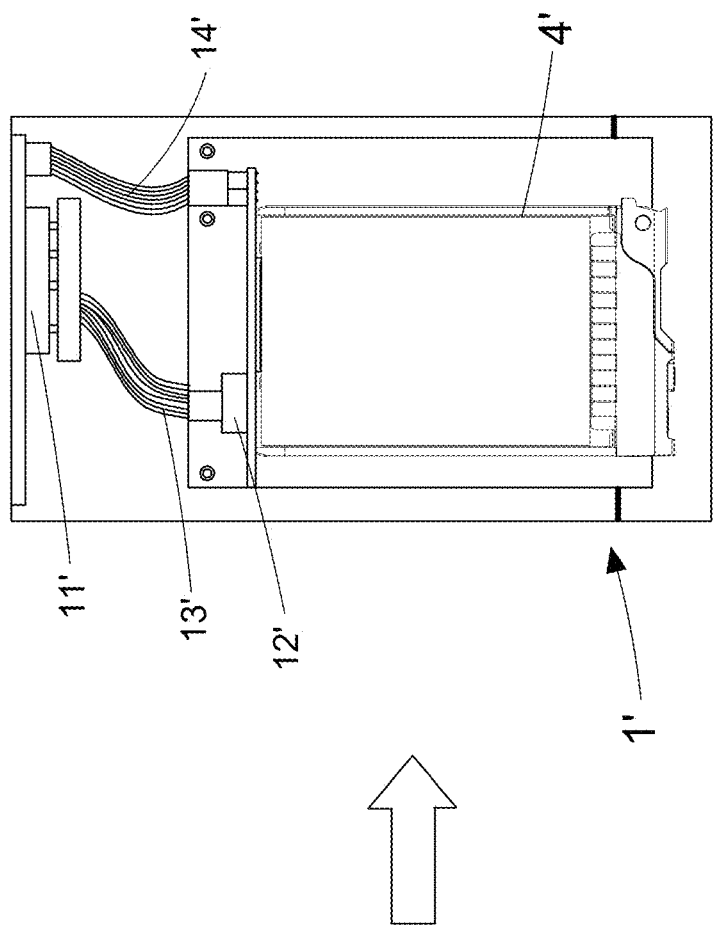
FIG. 1 shows a top view of a conventional data reader.
Figure 1:
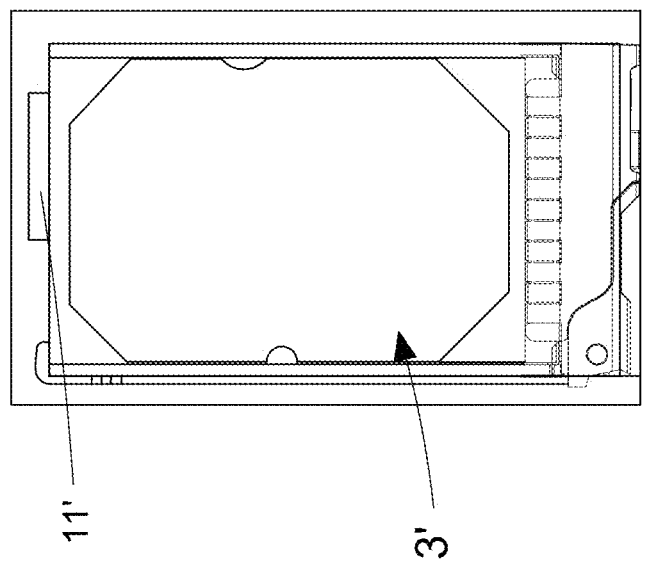
Figure 2:
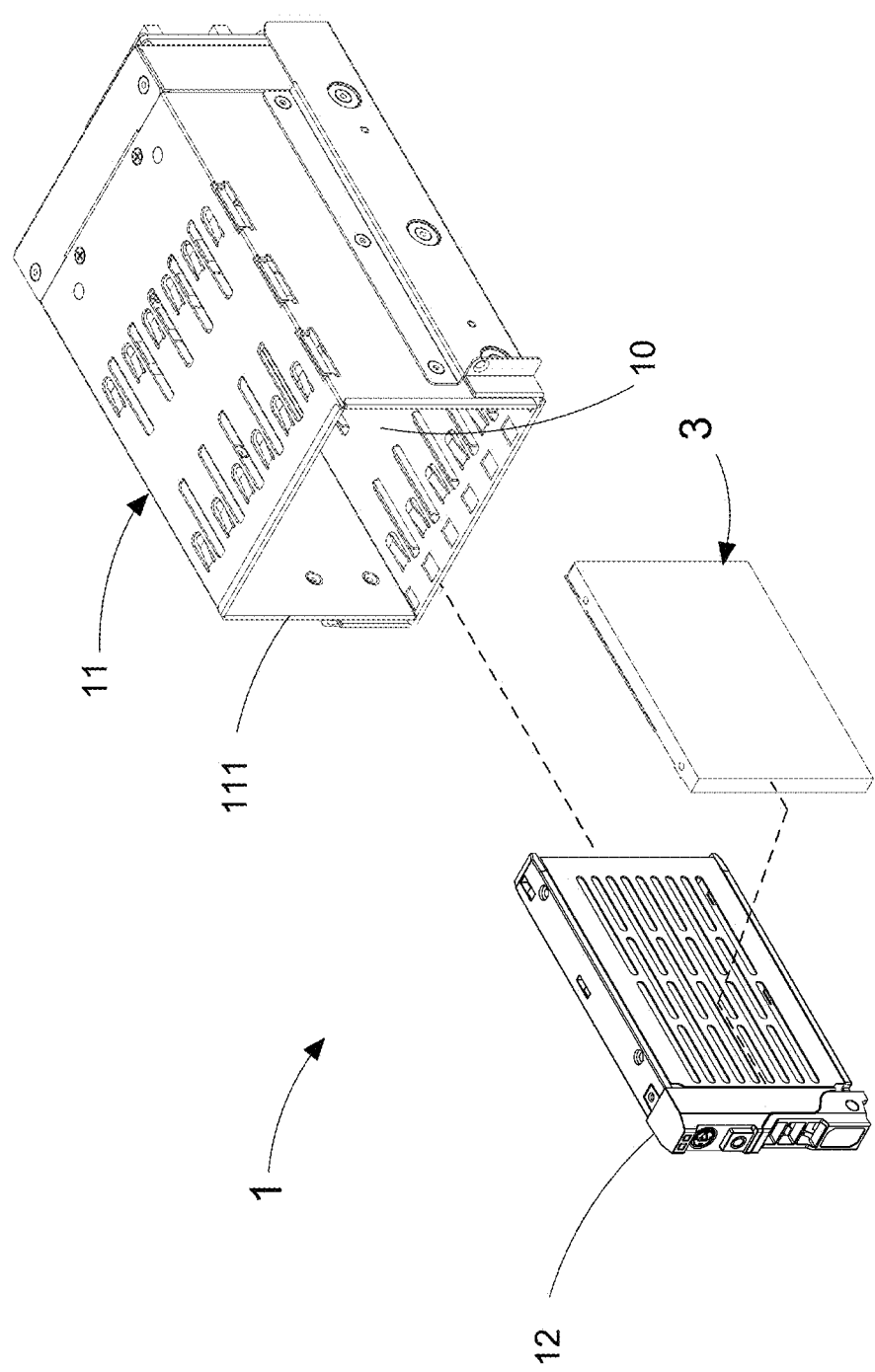
FIG. 2 shows a first stereo view and second stereo view of a hard drive enclosure according to the present invention.
Figure 3:
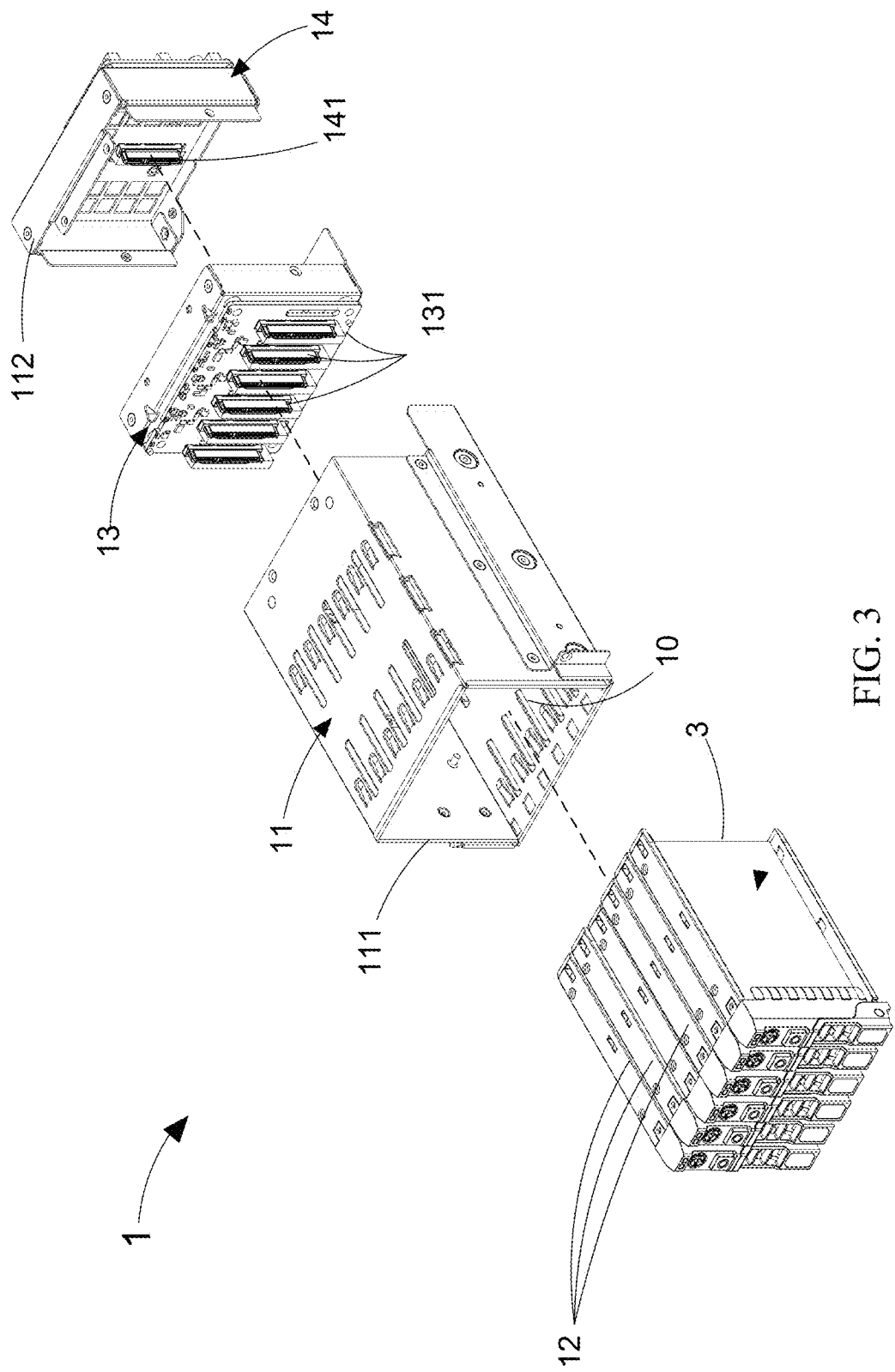
FIG. 3 shows a second stereo view of the hard drive enclosure.
Figure 4:
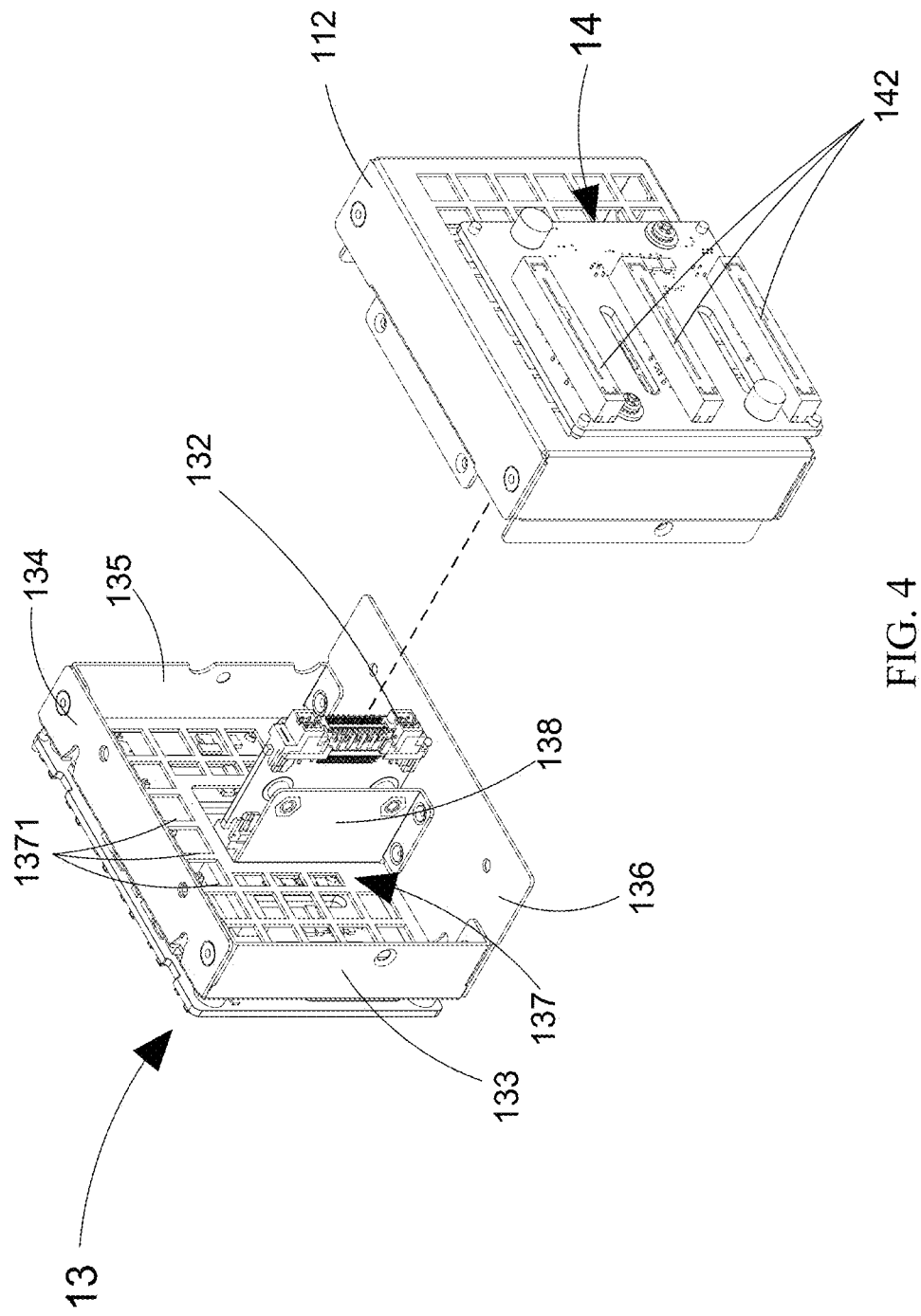
FIG. 4 shows a schematic stereo view of a connection interface module, and a connection module of the hard drive enclosure.

With reference to FIG. 2 and FIG. 3, which show a first stereo view and a second stereo view of a hard drive enclosure according to the present invention. Please simultaneously refer to FIG. 4 and FIG. 5, which show a schematic stereo view of a connection interface module, and a connection module and a third stereo view of a hard drive enclosure according to the present invention respectively. The hard drive enclosure 1 with functionality of quick-release, is for application in a host computer 2 and comprises: an accommodating unit 11, a plurality of removable units 12, a connection interface module 13, and a connection module 14. Wherein the accommodating unit has an accommodating space 10 and a receiving opening 111. As shown in FIG. 2, FIG. 3, and FIG. 4, the connection interface module 13 is disposed in the accommodating space 10, and comprises a plurality of connection portions 131 that are disposed to face the receiving opening 111, and a first electrical connector 132 that is connected to the plurality of connection portions 131. More particularly, each of the plurality of removable units 12 carries with a storage device 3, and the plurality of removable units 12 is inserted into the accommodating space 10 through the receiving opening 111 to electrically connect to the plurality of connection portions 131 respectively. It needs to further explain that, the connection module 14 is disposed on an outer surface of the accommodating unit 11, and the connection module 14 has a second electrical connector 142 and a third electrical connector 141. Wherein the second electrical connector 141 is extended into the accommodating space 10 for being electrically connected to the first electrical connector 132 of the connection interface module 13, and the third electrical connector 142 is electrically connected to at least one electrical connection member 22 in the host computer 2. It is worth noting that, after the plurality of removable units 12 is inserted into the accommodating space 10 through the receiving opening 111, the hard drive enclosure 1 electrically connect to the at least one electrical connection member 22 of the host computer 2 through the third electrical connector 142.

Inheriting to above descriptions, as shown in FIG. 4, the connection module 13 comprises: a first side plate 133, a second side plate 134, a third side plate 135, a support plate 136, a fixing plate 137, and a strengthening plate 138. Wherein one end of the second side plate 134 is connected to one end of the first side plate 133, and the other end of the second side plate 134 is connected to one end of the third side plate 135. Moreover, the other end of the third side plate 135 and the other end of the first side plate 133 connected to two ends of the support plate 136 respectively. As shown in FIG. 4, the fixing plate 137 is vertically connected to the first side plate 133, the second side plate 135, the third side plate 135, and the support plate 136, and the fixing plate 137 comprises a plurality of vents 1371 for dissipating heat in the hard drive enclosure 1. The plurality of connection portions 131 is disposed on the fixing plate 137. It is worth noting that, the strengthening plate 138 is vertically connected to the support plate 136 and the fixing plate 137. Moreover, the strengthening plate 138 is connected to one side of the first electrical connector 132, such that a connecting between the first electrical connector 132 and the plurality of connection portions 131 be strengthened, so as to increase durability and stability of the connection interface module 13. Furthermore, the second electrical connector 141 is extended into the accommodating space 10 from an outer surface of the accommodating unit 11 through a back plate 114 of the accommodating unit 11.

Continuously referring to FIG. 2, FIG. 3, FIG. 4, and FIG. 5. According to particular designs of the plurality of connection portions 131, the first electrical connector 132, and the connection module 14, so as to enhance the disadvantages of the conventional data reader 1'. It is conceivable that, it is capable of inserting the plurality of removable units 13 which carry the storage device 3 into the accommodating unit 11 in advance, so as to let a process for assembling the hard drive enclosure 1 into the host computer 2 is more efficient.

Figure 5:
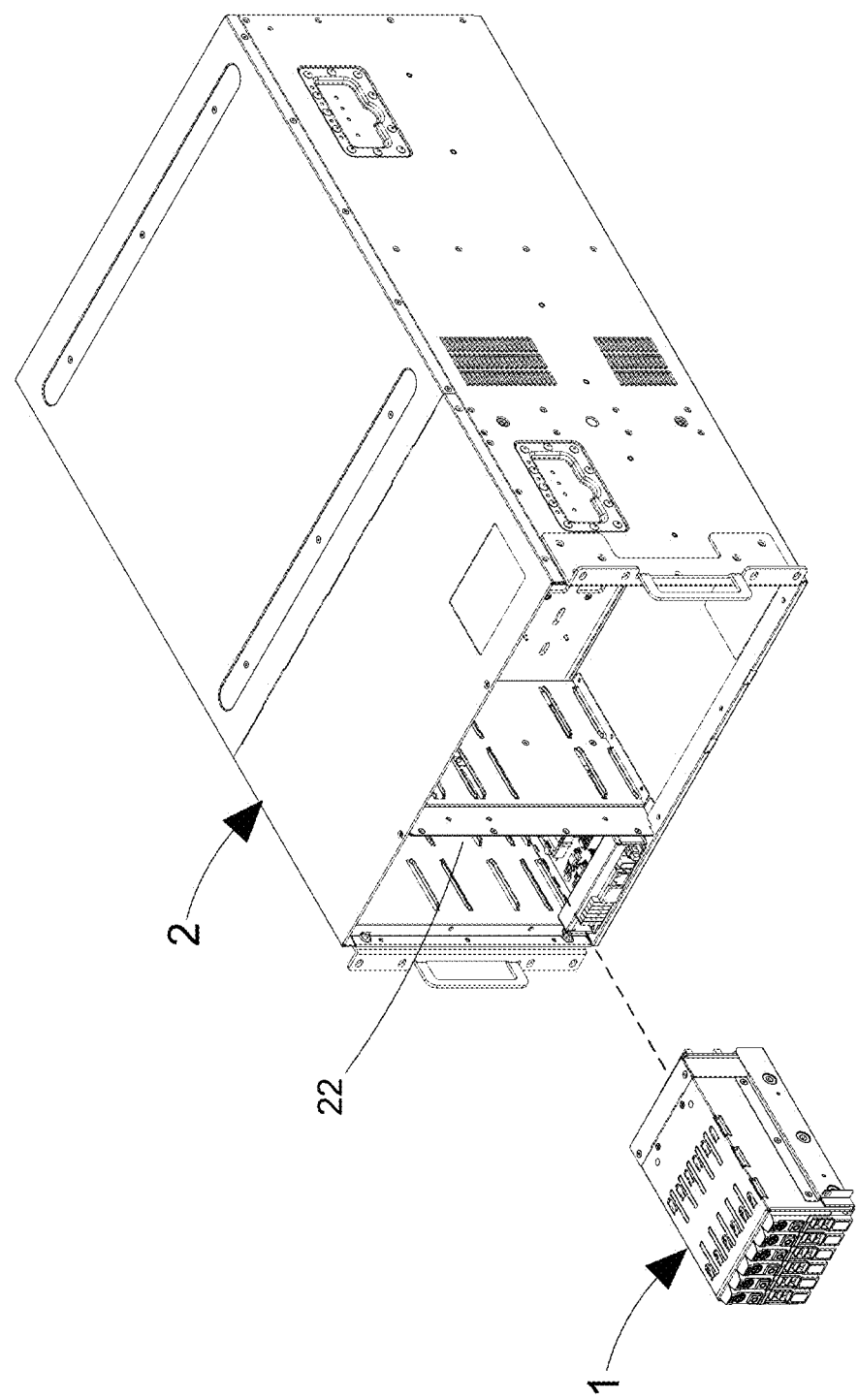
FIG. 5 shows a third stereo view of the hard drive enclosure.
Figure 6:
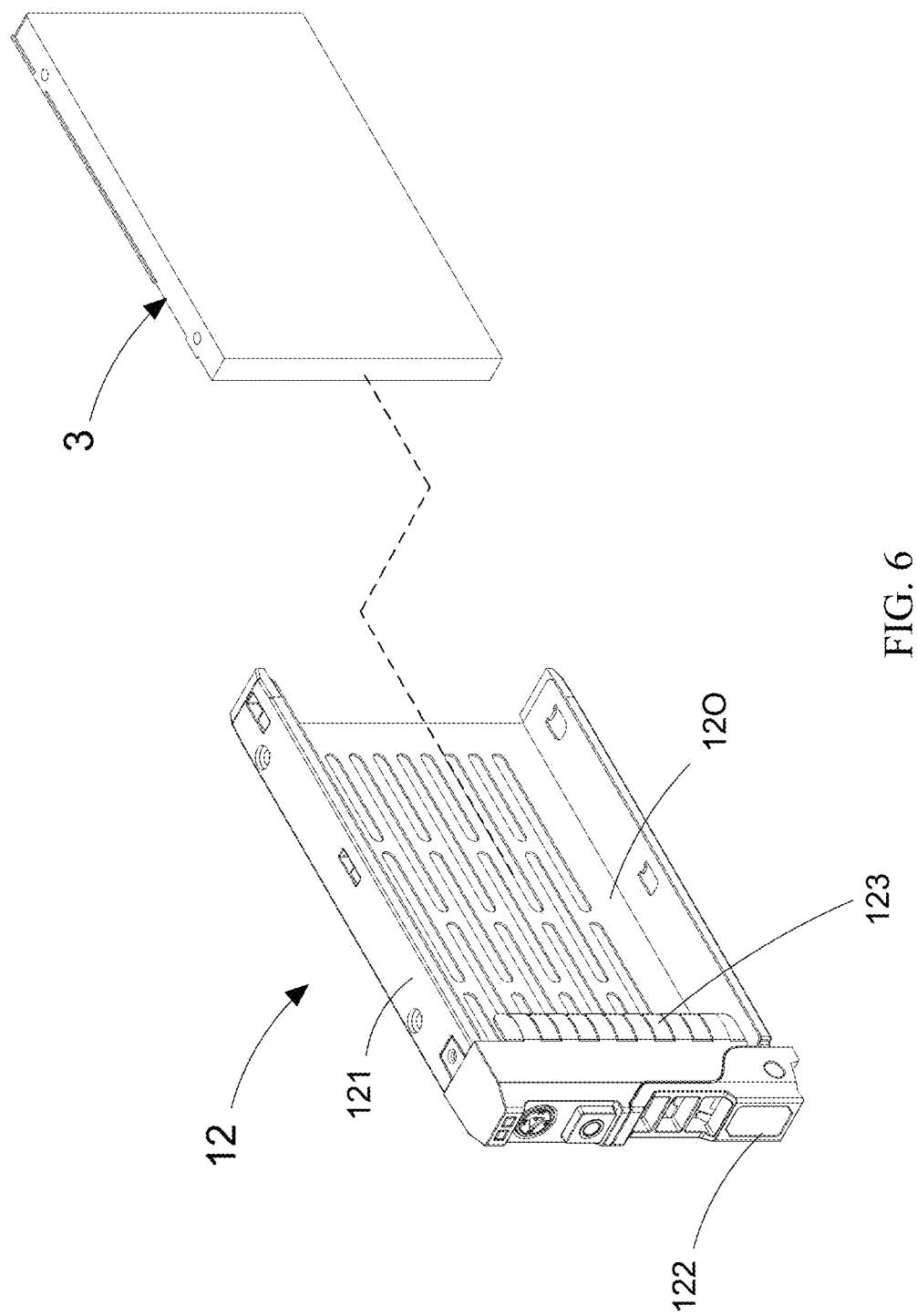
FIG. 6 shows a first schematic stereo view of a removable unit and a storage device of the hard drive enclosure.
Figure 7:
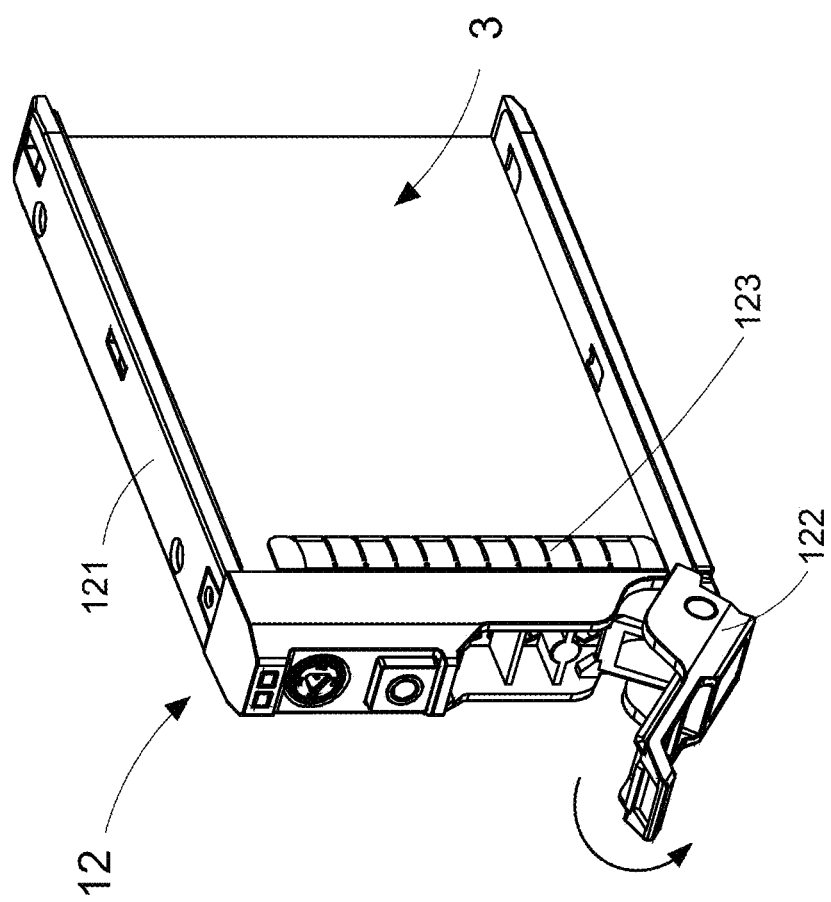
FIG. 7 shows a second schematic stereo view of a removable unit and a storage device of the hard drive enclosure.

Continuously referring to FIG. 3, FIG. 4, and FIG. 5. Please simultaneously refer to FIG. 6 and FIG. 7, which show a first and a second schematic stereo view of a removable unit and a storage device of the hard drive enclosure. As shown in FIG. 6 and FIG. 7, each removable unit comprises: a body 121, a handle member 122, and an electromagnetic shielding sheet 123. The body 121 has an accommodating slot120 for accommodating the storage device 3, and the handle member 122 is pivotally connected to a front surface of the body 121. Moreover, the electromagnetic shielding sheet 123 is disposed on the body 121 for shielding an interference of outer electromagnetic. In the present invention, the user rotates the handle member 122 a half turn to the first direction, and pull the removable unit 12 out of the accommodating space 10 by holding the handle member 12.

Figure 8:
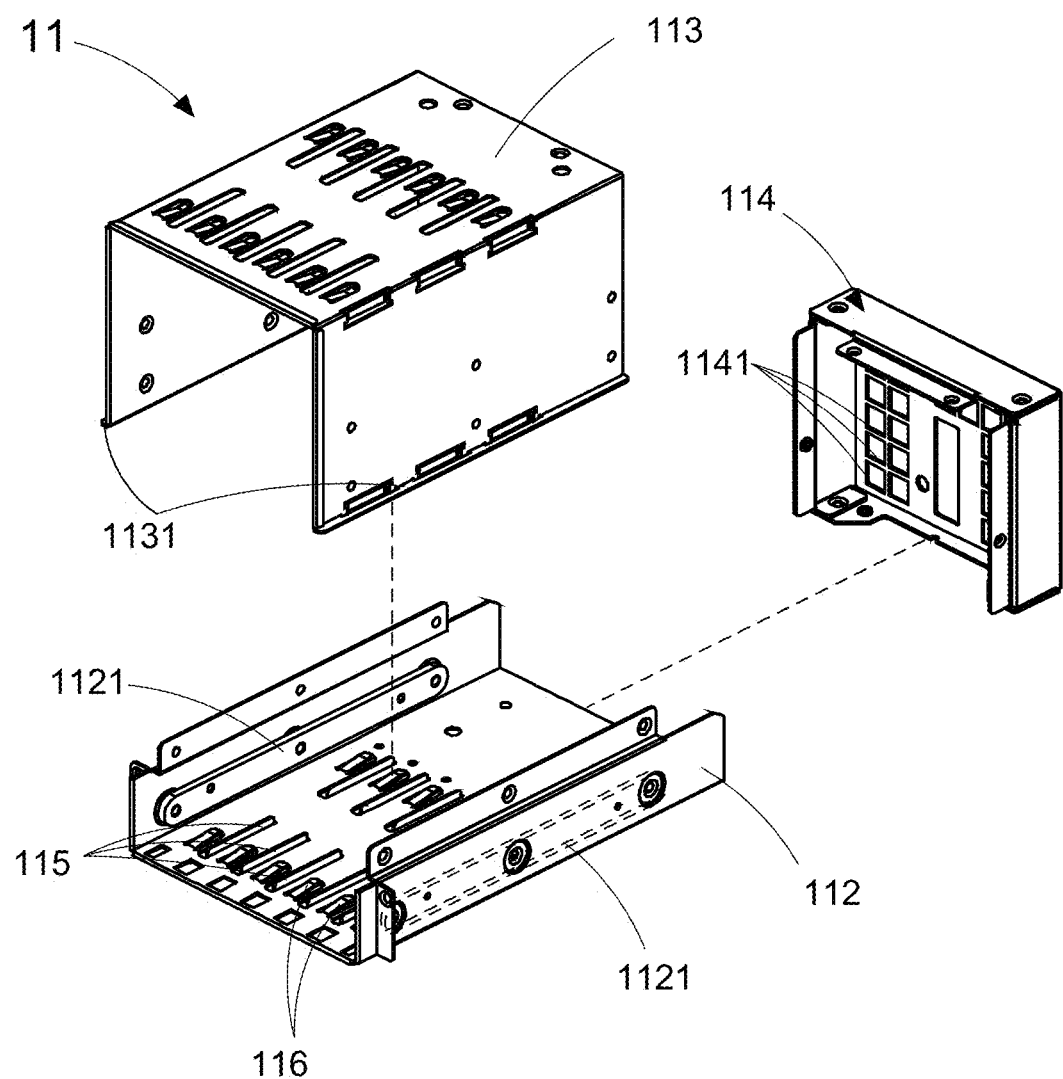
FIG. 8 shows a schematic stereo view for describing assembling of an accommodating unit of the hard drive enclosure.
Figure 9:
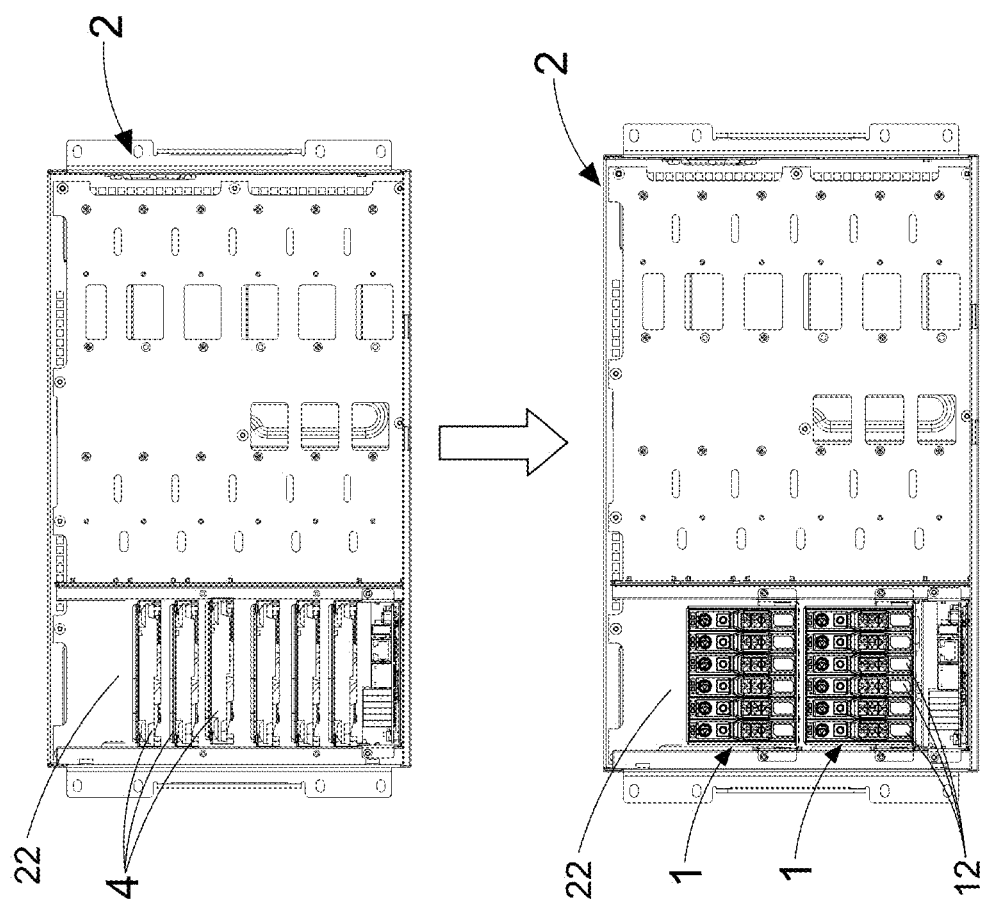
FIG. 9 shows a schematic view of the hard drive enclosure.

Referring to FIG. 2, FIG. 3, FIG. 4, and FIG. 5 again, and please simultaneously refer to FIG. 8, there is showing a schematic stereo view for describing assembling of an accommodating unit of the hard drive enclosure. As shown in FIG. 8, the accommodating unit 11 comprises: a bottom plate 112, a cover plate 113, and a back plate 114. Wherein the bottom plate 112 comprises two sliding rods 1121 which are respectively disposed on two side thereof, and the cover plate 113 comprises two engaged members 1131 which are respectively disposed on two side thereof. By such arrangements, the cover plate 113 assembles the bottom plate 112 by the two engaged members engaging with the respective two sliding rods 1121. Moreover, the back plate 114 is connected to one end of the bottom plate 112 and the cover plate 113 after assembling the cover plate 113 with the bottom plate 132. Furthermore, the back plate 114 has a plurality of ventilation holes 1141. More particularly, the accommodating unit 11 further comprises a plurality of sliding bars 115 and a plurality of engaging members 116. The plurality of sliding bars 115 is disposed on an inner surface of the accommodating unit 11 in parallel with each other, such that the plurality of removable units is capable of sliding in the accommodating space 10. Please simultaneously refer to FIG. 9, which shows a schematic view of the hard drive enclosure. It needs to further explain that, the first electrical connector 132, the second electrical connector 141 both are a printed circuit board assembly. In one embodiment of the present invention, the storage device 3 is a 2.5-inch HDD, and the at least one electrical connection member 22 the host computer 2 is used for reading 3.5-inch HDD. By such arrangements, the host computer 2 is capable of reading the 2.5-inch HDD through the hard drive enclosure 1, and the hard drive enclosure improve the narrow space for electrical routing of disadvantages of the conventional data reader. Wherein the host computer 2 is selected from the group consisting of computer host device, server computer, desk computer, laptop computer, and a minicomputer case. As shown in FIG. 9, the host computer 2 is capable of accommodating six 3.5-inch HDD 4. When the user wants to read the 2.5-inch HDD, the two hard drive enclosures 1 which both carry with the six 2.5-inch HDDs are inserted into the host computer 2 and electrically connected to the at least one electrical connection member 22 of the host computer 2, so as to achieve the host computer 2 accommodating and reading twelve 2.5-inch HDDs.

Therefore, through above descriptions, the locking mechanism proposed by the present invention have been introduced completely and clearly; in summary, the present invention includes the advantages of:

(1) Differing from the conventional data reader 1' having the disadvantages of decreasing manufacturing efficiency. The hard drive enclosure 1 of the present invention comprises: an accommodating unit 11, a plurality of removable units 12, a connection inter face module 13, and a connection module 14, wherein the accommodating unit 11 has an accommodating space 10 and a receiving opening 111. Moreover, the plurality of removable units 12 is inserted into the accommodating space 10 through the receiving opening 111, and each of the plurality of removable units 12 carries with a storage device 3. After inserting the hard drive enclosure 1 into a host computer 2, the connection interface module 13 is electrically connected to the storage device 3, and the connection module 14 is electrically connected to at least one electrical connection member 22 in the host computer 2, such that the host computer 2 is capable of reading/writing information in the storage device 3.

The above description is made on embodiments of the present invention. However, the embodiments are not intended to limit scope of the present invention, and all equivalent implementations or alterations within the spirit of the present invention still fall within the scope of the present invention.

What is claimed is:

1. A hard drive enclosure with functionality of quick-release, being for application in a host computer, and comprising:
    an accommodating unit, having an accommodating space and a receiving opening;
    a plurality of removable units, being inserted into the accommodating space through the receiving opening, and each of the plurality of removable units carries with a storage device;
    a connection interface module, being disposed in the accommodating space, and comprising a plurality of connection portions that are disposed to face the receiving opening and a first electrical connector that is connected to the plurality of connection portions; and
    a connection module, being disposed on an outer surface of the accommodating unit, and having a second electrical connector and a third electrical connector, wherein the second electrical connector is extended into the accommodating space 10 for being electrically connected to the first electrical connector of the connection interface module, and the third electrical connector is electrically connected to at least one electrical connection member in the host computer;
    wherein the respective storage devices are electrically connected to the respective connection portions.

2. The hard drive enclosure of claim 1, wherein the removable unit comprises:
    a body, having an accommodating slot for accommodating the storage device;
    a handle member, being pivotally connected to a front surface of the body; and
    an electromagnetic shielding sheet, being disposed on the body.

3. The hard drive enclosure of claim 1, wherein the host computer is selected from the group consisting of computer host device, server computer, desk computer, laptop computer, and a minicomputer case.

4. The hard drive enclosure of claim 1, wherein the accommodating unit comprises:
    a bottom plate, comprising two sliding rods disposed on two side thereof respectively;
    a cover plate, comprising two engaged members disposed on two side thereof respectively; wherein the cover plate assembles the bottom plate by the two respective engaged members engaging with the two respective sliding rods; and
    a back plate, being connected to one end of the bottom plate and the cover plate, and being connected to the connection interface module;
    wherein the back plate has a plurality of ventilation holes.

5. The hard drive enclosure of claim 1, wherein the first electrical connector, the second electrical connector, and the third electrical connector both are a printed circuit board assembly.

6. The hard drive enclosure of claim 1, wherein the connection interface module comprises:
    a first side plate;
    a second side plate, being connected to one end of the first side plate by one end thereof;
    a third side plate, being connected to the other end of the second side plate by one end thereof; wherein the other end of the third side plate and the other end of the first side plate connect to two ends of a support plate respectively;
    a fixing plate, being vertically connected to the first side plate, the second side plate, the third side plate, and the support plate, and comprising a plurality of vents; wherein the plurality of connection portions is disposed on the fixing plate; and
    a strengthening plate, being vertically connected to the support plate and the fixing plate, and being connected to the first electrical connector, such that the first electrical connector is stably connected to the plurality of connection portion.

7. The hard drive enclosure of claim 1, wherein the accommodating unit comprises:
    a plurality of sliding bars, being disposed on an inner surface of the accommodating unit in parallel with each other, such that the plurality of removable units is capable of sliding in the accommodating space.

8. The hard drive enclosure of claim 4, wherein the second electrical connector passes-through the back plate from a surface of the accommodating unit, so as to be disposed in the accommodating space.

9. The hard drive enclosure of claim 7, wherein the accommodating unit further comprises:
    a plurality of engaging members; wherein each of the plurality of engaging members is disposed between the respective two of plurality of sliding bars, such that the plurality of removable units engages with the respective engaging members when being disposed in the accommodating space.

* * * * *